US 8,415,997 B2

(12) United States Patent
Li et al.

(10) Patent No.: US 8,415,997 B2
(45) Date of Patent: Apr. 9, 2013

(54) SIGNAL SYNCHRONIZING SYSTEMS (75) Inventors: Ye Li, Sichuan (CN); Gang Li, Sichuan (CN); Guoyong Guo, Santa Clara, CA (US)

(73) Assignee: 02Micro Inc., Sunnyvale, CA (US)

( * ) Notice: Subject to any disclaimer, the term of this patent is extended or adjusted under 35 U.S.C. 154(b) by 88 days.

(21) Appl. No.: 13/157,900

(22) Filed: Jun. 10, 2011

(65) Prior Publication Data

US 2012/0313681 A1    Dec. 13, 2012

(51) Int. Cl.
 *H03L 7/06*    (2006.01)
(52) U.S. Cl. ..................... 327/156; 327/147
(58) Field of Classification Search ............... 327/147, 327/156
See application file for complete search history.

(56) References Cited

U.S. PATENT DOCUMENTS

| | | | | |
|---|---|---|---|---|
| 6,614,317 B2* | 9/2003 | Wong et al. | ..... | 331/17 |
| 6,965,660 B2* | 11/2005 | Strohmayer | ..... | 375/376 |
| 7,084,709 B1* | 8/2006 | Leong et al. | ..... | 331/11 |
| 7,102,446 B1* | 9/2006 | Lee et al. | ..... | 331/11 |
| 7,180,377 B1* | 2/2007 | Leong et al. | ..... | 331/17 |
| 7,183,863 B1* | 2/2007 | Bedrosian | ..... | 331/25 |
| 8,258,834 B2* | 9/2012 | Xiu | ..... | 327/156 |
| 2005/0078783 A1* | 4/2005 | Okita | ..... | 375/376 |
| 2006/0087352 A1* | 4/2006 | Byun et al. | ..... | 327/156 |
| 2006/0164138 A1* | 7/2006 | Kakuta | ..... | 327/156 |
| 2007/0195637 A1* | 8/2007 | Lin | ..... | 365/233 |
| 2010/0195779 A1* | 8/2010 | Sai | ..... | 375/376 |
| 2011/0227616 A1* | 9/2011 | Jang et al. | ..... | 327/157 |
| 2011/0254601 A1* | 10/2011 | Xiu | ..... | 327/157 |
| 2012/0119800 A1* | 5/2012 | Yamasaki et al. | ..... | 327/142 |
| 2012/0154002 A1* | 6/2012 | Ahn et al. | ..... | 327/158 |
| 2012/0206176 A1* | 8/2012 | Hwang et al. | ..... | 327/156 |

* cited by examiner

*Primary Examiner* — Adam Houston (57) ABSTRACT

A signal synchronizing system includes comparison circuitry and control circuitry. The comparison circuitry compares a synchronizing signal with an input signal to generate a comparison result. The control circuitry adjusts the synchronizing signal into a range that is determined by the input signal, and controls the range according to the comparison result.

20 Claims, 6 Drawing Sheets

SIGNAL SYNCHRONIZING SYSTEMS

BACKGROUND

Conventional signal synchronizing systems change the synchronizing signals, e.g., internal clock signals, in response to any variation of the synchronized signals, e.g., external clock signals. Disadvantageously, the signal synchronizing system is sensitive to any change in the external clock signal, and the internal clock signal of the system is relatively unstable.

SUMMARY

In one embodiment, a signal synchronizing system includes comparison circuitry and control circuitry coupled to the comparison circuitry. The comparison circuitry can compare a synchronizing signal with an input signal to generate a comparison result. The control circuitry can adjust the synchronizing signal into a range that is determined by the input signal, and control the range according to the comparison result.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, the present invention provides a system to synchronize a synchronizing signal, e.g., an internal clock or oscillating signal, with an input signal, e.g., an external clock or oscillating signal. The system can synchronize the synchronizing signal with the input signal by adjusting the frequency of the synchronizing signal into a range. The range can be, but is not necessarily, centered at the frequency of the input signal. The system can further control, e.g., widen or narrow, the range, such that the synchronizing signal can be synchronized with the input signal relatively accurately and have enhanced stability.

Figure 1:
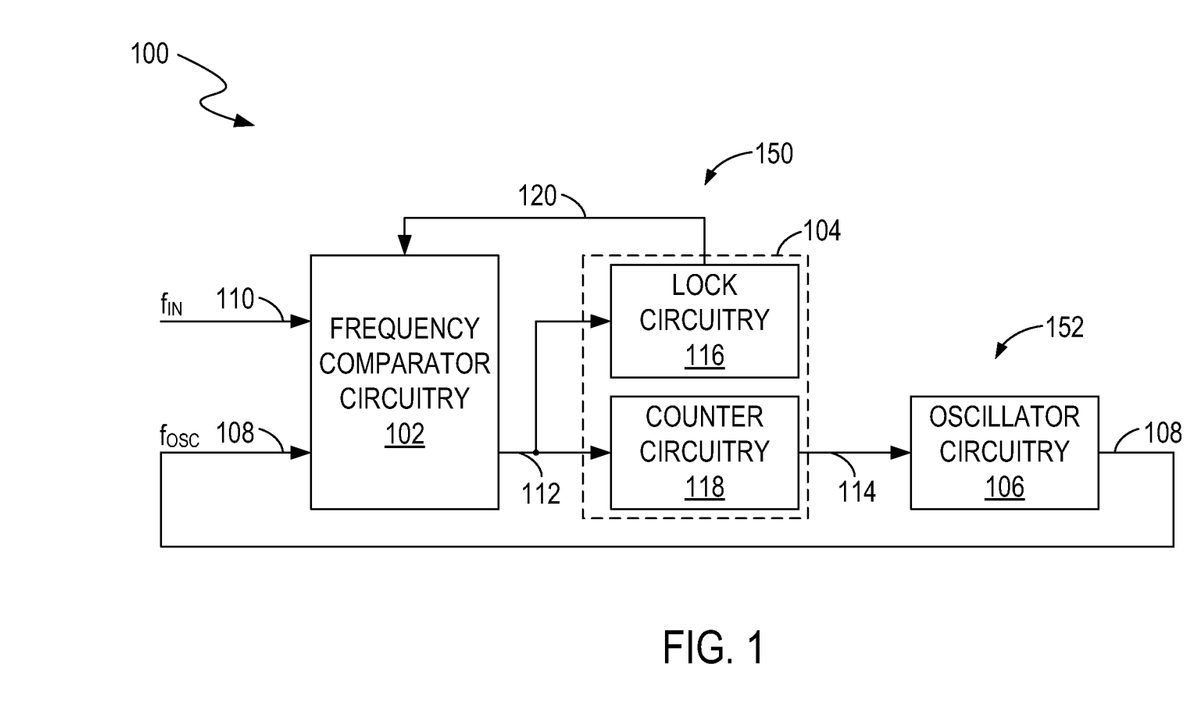
FIG. 1 illustrates a block diagram of an example of a signal synchronizing system, in accordance with one embodiment of the present invention.

FIG. 1 illustrates a block diagram of an example of a signal synchronizing system 100, in accordance with one embodiment of the present invention. The signal synchronizing system 100, e.g., a frequency synchronizing system, is operable for synchronizing a synchronizing signal 108, e.g., an internal clock/oscillating signal, with an input signal 110, e.g., an external clock/oscillating signal. For example, the signal synchronizing system 100 generates a synchronizing signal 108, and controls the synchronizing signal 108 so that is has substantially the same frequency as the input signal 110.

The signal synchronizing system 100 includes control circuitry 150 and signal generator circuitry 152. In one embodiment, the control circuitry 150 includes frequency comparator circuitry 102 and digital controller circuitry 104. The digital controller circuitry 104 includes lock circuitry 116 and counter circuitry 118. The signal generator circuitry 152 includes oscillator circuitry 106.

The signal generator circuitry 152 generates the synchronizing signal 108. The control circuitry 150 receives the synchronizing signal 108 and the input signal 110, and adjusts a synchronizing frequency $f_{OSC}$ of the synchronizing signal 108 into a lock range that is determined by an input frequency $f_{IN}$ of the input signal 110. The lock range can be, but may not be, centered at the input frequency $f_{IN}$. If the synchronizing frequency $f_{OSC}$ is within the lock range, then the synchronizing frequency $f_{OSC}$ is considered to be equal to or substantially equal to the input frequency $f_{IN}$. In other words, if the synchronizing frequency $f_{OSC}$ is within the lock range, then the synchronizing signal 108 is considered to be synchronized with the input signal 110. In one embodiment, when the synchronizing frequency $f_{OSC}$ is within the lock range, the synchronizing frequency $f_{OSC}$ can remain unchanged as long as the variation of the input frequency $f_{IN}$ does not cause the synchronizing frequency $f_{OSC}$ to be outside the lock range. Moreover, in one embodiment, when the synchronizing frequency $f_{OSC}$ is adjusted into the lock range, the lock range is widened by the control circuitry 150. Thus, advantageously, the stability of the signal synchronizing system 100 and the synchronizing signal 108 is enhanced.

More specifically, in one embodiment, the frequency comparator circuitry 102 compares the synchronizing frequency $f_{OSC}$ of the synchronizing signal 108 with the input frequency $f_{IN}$ of the input signal 110 to generate a comparison result 112. The comparison result 112 indicates a status of the difference between the synchronizing frequency $f_{OSC}$ and the input frequency $f_{IN}$. The comparison result 112 can include one of three situations: the synchronizing frequency $f_{OSC}$ is less than the input frequency $f_{IN}$; the synchronizing frequency $f_{OSC}$ is greater than the input frequency $f_{IN}$; or the synchronizing frequency $f_{OSC}$ is substantially equal to the input frequency $f_{IN}$. The digital controller circuitry 104 generates a control signal 114 to the oscillator circuitry 106 according to the comparison result 112. The oscillator circuitry 106 adjusts the synchronizing frequency $f_{OSC}$ according to the control signal 114. By way of example, if the synchronizing frequency $f_{OSC}$ is less than the input frequency $f_{IN}$, e.g., the synchronizing frequency $f_{OSC}$ is less than the input frequency $f_{IN}$ minus a first frequency offset $f_{OSC}$, then the control signal 114 increases the synchronizing frequency $f_{OSC}$. In other words, if the difference $f_{OSC}-f_{IN}$ is less than a first frequency offset −$f_{OSC}$, the signal generator circuitry 152 increases the synchronizing frequency $f_{OSC}$. If the synchronizing frequency $f_{OSC}$ is greater than the input frequency $f_{IN}$, e.g., the synchronizing frequency $f_{OSC}$ is greater than the input frequency $f_{IN}$ plus a second frequency offset $f_{OS2}$, then the control signal 114 decreases the synchronizing frequency $f_{OSC}$. In other words, if the difference $f_{OSC}-f_{IN}$ is greater than the frequency offset $f_{OS2}$, the signal generator circuitry 152 decreases the synchronizing frequency $f_{OSC}$. Thus, the synchronizing frequency $f_{OSC}$ can be adjusted into a range of $f_{IN}-f_{OS1}$ to $f_{IN}+f_{OS2}$ (hereinafter, range ($f_{IN}-f_{OS1}$, $f_{IN}+f_{OS2}$)). The range ($f_{IN}-f_{OS1}$, $f_{IN}+f_{OS2}$) can be referred to as a lock range. The first frequency offset $f_{OSC}$ and the second frequency offset $f_{OS2}$ can be, but may not be, the same. When the synchronizing frequency $f_{OSC}$ is within the lock range, the synchronizing frequency $f_{OSC}$ is considered to be equal to or substantially equal to the input frequency $f_{IN}$.

In other words, the signal generator circuitry 152 can generate the synchronizing signal 108 according to the comparison result 112, e.g., the difference between the synchronizing signal 108 and the input signal 110. The control circuitry 150 can generate the comparison result 112 by comparing the synchronizing signal 108 and the input signal 110, such that the synchronizing signal 108 is adjusted into a lock range, e.g., range ($f_{IN}-f_{OS1}$, $f_{IN}+f_{OS2}$).

Furthermore, the digital controller circuitry 104 controls the lock range according to the comparison result 112, e.g., the difference between the synchronizing frequency $f_{osc}$ and the input frequency $f_{IN}$. By way of example, if the comparison result 112 indicates that the synchronizing signal 108 is outside the lock range ($f_{IN}-f_{OS1}$, $f_{IN}+f_{OS2}$), e.g., $f_{OSC}-f_{IN}<-f_{OS1}$ or $f_{OSC}-f_{IN}>f_{OS2}$, the digital controller circuitry 104 controls the lock range to have a first width, e.g., $f_{OS1}+f_{OS2}$. If the comparison result 112 indicates that the synchronizing signal 108 is within the lock range ($f_{IN}-f_{OS1}$, $f_{IN}+f_{OS2}$), e.g., −$f_{OS1}<f_{OSC}-f_{IN}<f_{OS2}$, the lock circuitry 116 generates a lock/unlock signal 120 to lock the synchronizing signal 108, e.g., by controlling the lock range to have a second width that is greater than the first width. For instance, the digital controller circuitry 104 can adjust the first frequency offset from $f'_{OS1}$ to $f'_{OS1}$ ($f_{OS1}<f'_{OS1}$) and adjust the second frequency offset from $f_{OS2}$ to $f'_{OS2}$ ($f_{OS2}<f'_{OS2}$), and therefore the lock range is from $f_{IN}-f'_{OS1}$ to $f_{IN}+f'_{OS2}$. In this instance, the second width of the lock range is $f'_{OS1}+f'_{OS2}$ and is greater than the first width $f_{OS1}+f_{OS2}$.

In operation, in one embodiment, when the signal synchronizing system 100 is enabled, the lock range for the synchronizing signal 108 is preset to the range ($f_{IN}-f_{OS1}$, $f_{IN}+f_{OS2}$), and the lock range has the first width $f_{OS1}+f_{OS2}$. If the synchronizing signal 108 is outside the range ($f_{IN}-f_{OS1}$, $f_{IN}+f_{OS2}$), the control circuitry 150 adjusts the synchronizing frequency $f_{OSC}$ toward the input frequency $f_{IN}$. When the synchronizing frequency $f_{OSC}$ is adjusted to be substantially equal to the input frequency $f_{IN}$, e.g., the synchronizing frequency $f_{OSC}$ is within the range ($f_{IN}-f_{OS1}$, $f_{IN}+f_{OS2}$), the lock circuitry 116 generates a lock/unlock signal 120 to lock the synchronizing signal 108, e.g., by increasing the lock range to the second width $f'_{OS1}+f'_{OS2}$. The synchronizing frequency $f_{OSC}$ can remain unchanged as long as the synchronizing frequency $f_{OSC}$ is within the range ($f_{IN}-f'_{OS1}$, $f_{IN}+f'_{OS2}$). In other words, the synchronizing frequency $f_{OSC}$ can remain unchanged if the variation of the input frequency $f_{IN}$ does not cause the synchronizing frequency $f_{OSC}$ to be outside the range ($f_{IN}-f'_{OS1}$, $f_{IN}+f'_{OS2}$). Additionally, if a change in the input frequency $f_{IN}$ causes the synchronizing frequency $f_{OSC}$ to be outside the range ($f_{IN}-f'_{OS1}$, $f_{IN}+f'_{OS2}$), the lock circuitry 116 generates a lock/unlock signal 120 to unlock the synchronizing signal 108, e.g., by decreasing the lock range to the first width $f_{OS1}+f_{OS2}$. The control circuitry 150 can adjust the synchronizing signal 108 into the range ($f_{IN}-f_{OS1}$, $f_{IN}+f_{OS2}$) again.

In one embodiment, compared with the input frequency $f_{IN}$, the first width $f_{OS1}+f_{OS2}$ is relatively small. In addition, the second width $f'_{OS1}+f'_{OS2}$ can be set according to a normal variation amplitude of the input frequency $f_{IN}$. For example, the second width $f'_{OS1}+f'_{OS2}$ can be greater than the normal variation amplitude of the input frequency $f_{IN}$. As a result, the synchronizing signal 108 can be synchronized with the input signal 110 relatively accurately, and the stability of the synchronizing signal 108 can be enhanced.

Figure 2:
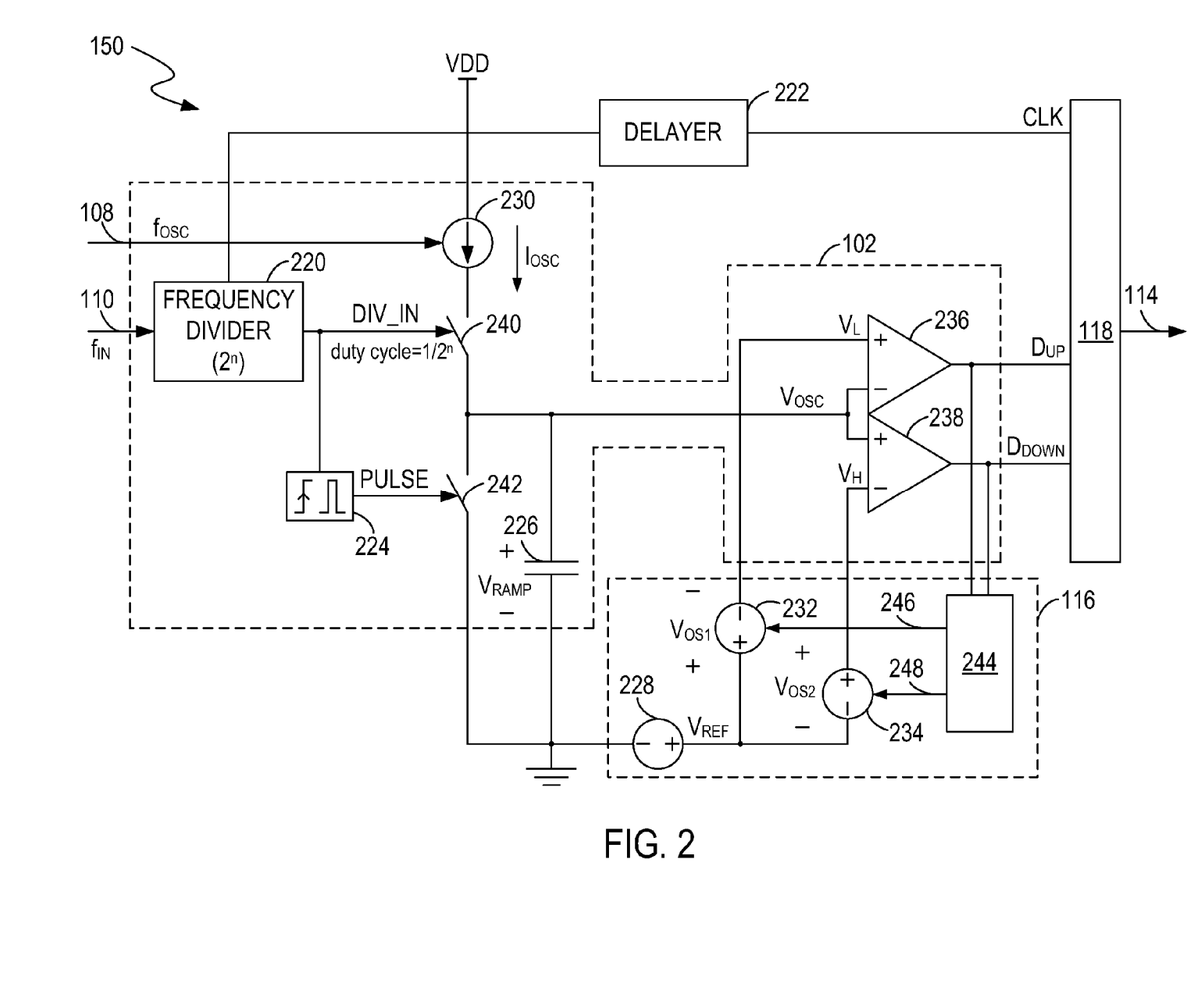
FIG. 2 illustrates a circuit diagram of an example of the control circuitry in FIG. 1, in accordance with one embodiment of the present invention.

FIG. 2 illustrates a circuit diagram of an example of the control circuitry 150, in accordance with one embodiment of the present invention. FIG. 2 is described in combination with FIG. 1. The control circuitry 150 includes the frequency comparator circuitry 102, the lock circuitry 116, and the counter circuitry 118.

As shown in FIG. 2, the frequency comparator circuitry 102 includes a frequency divider 220, a pulse generator 224, a power source 230, a charging switch 240, a discharging switch 242, capacitive circuitry 226, and comparators 236 and 238. In the example of FIG. 2, the power source 230 includes a frequency-controlled current source, and the capacitive circuitry 226 includes a capacitor.

In one embodiment, the frequency divider 220 receives the input signal 110 and generates a clock signal DIV_IN (hereinafter, DIV_IN signal) having a frequency that is $\frac{1}{2^n}$ times of the input frequency $f_{IN}$ (n=0, 1, 2, . . . ). The cycle of the DIV_IN signal therefore is equal to $2^n/f_{IN}$. Additionally, the duty cycle of the DIV_IN signal is controlled to be $\frac{1}{2^g}$. Thus, the time when the DIV_IN signal is logic high in each cycle is equal to the time of $1/f_{IN}$. The charging switch 240 is turned on when the DIV_IN signal is logic high, and is turned off when the DIV_IN signal is logic low. In other words, the charging switch 240 can be controlled by the input signal 110. The pulse generator 224 can generate a pulse signal PULSE (hereinafter, PULSE signal) at each rising edge of the DIV_IN signal to turn on the discharging switch 242. In one embodiment, the power source 230 generates a charging current $I_{OSC}$, according to the synchronizing frequency $f_{OSC}$ and a preset reference $V_{REF}$, to charge the capacitive circuitry 226 via the charging switch 240. The charging current $I_{OSC}$ can be given by:

$$I_{OSC}=C_{OSC}*V_{REF}*f_{OSC}, \quad (1)$$

where $C_{OSC}$ represents a capacitance parameter in the oscillator circuitry 106. In one such embodiment, during a cycle of the DIV_IN signal, the charging switch 240 is turned on for the time of $1/f_{IN}$. Therefore, the capacitive circuitry 226 is charged to have a top voltage level $V_{OSC}$ that is given by:

$$V_{OSC}=I_{OSC}/(C_{RAMP}*f_{IN}), \quad (2)$$

where $C_{RAMP}$ represents capacitance of the capacitive circuitry 226. According to equations (1) and (2), the following equation is obtained:

$$f_{OSC}/f_{IN}=(V_{OSC}/V_{REF})*(C_{RAMP}/C_{OSC}). \quad (3)$$

Equation (3) can also be written as:

$$f_{OSC} - f_{IN} = [(V_{OSC}/V_{REF})*(C_{RAMP}/C_{OSC}) - 1]*f_{IN}. \quad (4)$$

The capacitances $C_{OSC}$ and $C_{RAMP}$ can be chosen such that the ratio $C_{OSC}/C_{RAMP}$ is equal to one. As such, equations (3) and (4) can be rewritten as:

$$f_{OSC}/f_{IN} = V_{OSC}/V_{REF}, \text{ and} \quad (5)$$

$$f_{OSC} - f_{IN} = (V_{OSC}/V_{REF} - 1)*f_{IN}. \quad (6)$$

Accordingly, if the top voltage level $V_{OSC}$ is equal to the preset reference $V_{REF}$, the synchronizing frequency $f_{OSC}$ is equal to the input frequency $f_{IN}$. Additionally, if the top voltage level $V_{OSC}$ is greater than the preset reference $V_{REF}$, the synchronizing frequency $f_{OSC}$ is greater than the input frequency $f_{IN}$. If the top voltage level $V_{OSC}$ is less than the preset reference $V_{REF}$, the synchronizing frequency $f_{OSC}$ is less than the input frequency $f_{IN}$.

In one such embodiment, at each rising edge of the DIV_IN signal, the PULSE signal turns on the discharging switch 242 to discharge the capacitive circuitry 226, and a ramp voltage $V_{RAMP}$ on the capacitive circuitry 226 can drop to zero volts. In addition, during each cycle of the DIV_IN signal, the DIV_IN signal turns on the charging switch 240 for the time of $1/f_{IN}$, and turns off the charging switch 240 during the rest of the cycle. Accordingly, in each cycle of the DIV_IN signal, the ramp voltage $V_{RAMP}$ can increase from zero volts to the top voltage level $V_{OSC}$, and then remain unchanged until the cycle expires, e.g., the discharging switch 242 is turned on.

Figure 3:
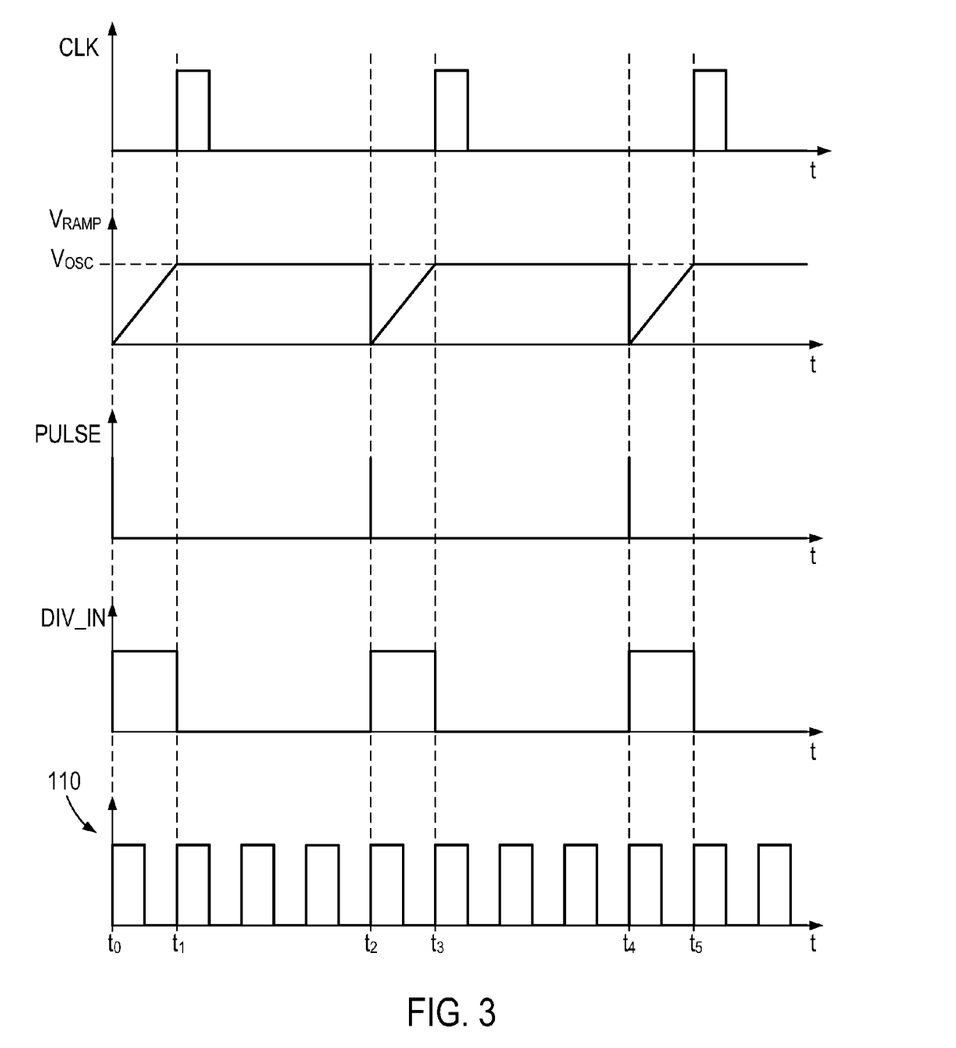
FIG. 3 illustrates a timing diagram of examples of signals associated with the signal synchronizing system in FIG. 1, in accordance with one embodiment of the present invention.

A timing diagram of examples of the input signal 110, the DIV_IN signal, the PULSE signal, the ramp voltage $V_{RAMP}$, and a clock signal CLK (hereinafter, CLK signal) is illustrated in FIG. 3, in accordance with one embodiment of the present invention. FIG. 3 is described in combination with FIG. 1 and FIG. 2. In the example of FIG. 3, the frequency of the DIV_IN signal is ¼ times of the input frequency $f_{IN}$. Since the duty cycle of the DIV_IN signal is controlled to be ¼, the time when the DIV_IN signal is logic high in a cycle of the DIV_IN signal is equal to the time of $1/f_{IN}$.

As shown in FIG. 3, during time $t_0$ to time $t_1$, the DIV_IN signal is logic high and the PULSE signal is logic low. Thus, the charging switch 240 is on and the discharging switch 242 is off. The ramp voltage $V_{RAMP}$ increases due to the charging of the capacitive circuitry 226. At time $t_1$, the ramp voltage $V_{RAMP}$ increases to the top voltage level $V_{OSC}$, e.g., given by equation (2). During time $t_1$ to time $t_2$, the DIV_IN and PULSE signals are logic low and the switches 240 and 242 are off. Therefore, the ramp voltage $V_{RAMP}$ remains at the top voltage level $V_{OSC}$. At time $t_2$, in response to a rising edge of the DIV_IN signal, the PULSE signal becomes logic high to turn on the discharging switch 242. The ramp voltage $V_{RAMP}$ can drop to zero volts due to the discharging of the capacitive circuitry 226. In the cycle from time $t_2$ to time $t_4$, the DIV_IN signal, the PULSE signal, and the ramp voltage $V_{RAMP}$ can be similar to those in the cycle from time $t_0$ to time $t_2$.

Returning to FIG. 2, the comparators 236 and 238 compare the top voltage level $V_{OSC}$ with a low boundary reference $V_L$ and a high boundary reference $V_H$ ($V_H > V_L$) to generate digital signals $D_{UP}$ and $D_{DOWN}$. In one embodiment, the comparison result 112 in FIG. 1 includes the digital signals $D_{UP}$ and $D_{DOWN}$. In one embodiment, the boundary references $V_L$ and $V_H$ are determined by the preset reference $V_{REF}$ in equation (1). For example, the low boundary reference $V_L$ is equal to the preset reference $V_{REF}$ minus a voltage offset $V_{OS1}$, and the high boundary reference $V_H$ is equal to the preset reference $V_{REF}$ plus a voltage offset $V_{OS2}$. If the top voltage level $V_{OSC}$ is less than the low boundary reference $V_L$, e.g., $V_{REF} - V_{OS1}$, then the digital signal $D_{UP}$ is logic high and the digital signal $D_{DOWN}$ is logic low, i.e., $D_{UP} = 1$ and $D_{DOWN} = 0$. If the top voltage level $V_{OSC}$ is greater than high boundary reference $V_H$, e.g., $V_{REF} + V_{OS2}$, then the digital signal $D_{UP}$ is logic low and the digital signal $D_{DOWN}$ is logic high, i.e., $D_{UP} = 0$ and $D_{DOWN} = 1$. If the top voltage level $V_{OSC}$ is in the range from $V_L$ to $V_H$, e.g., in the range $V_{REF} - V_{OS1}$ to $V_{REF} + V_{OS2}$, then the digital signals $D_{UP}$ and $D_{DOWN}$ are logic low, i.e., $D_{UP} = 0$ and $D_{DOWN} = 0$. In one embodiment, when the top voltage level $V_{OSC}$ is in the range from $V_{REF} - V_{OS1}$ to $V_{REF} + V_{OS2}$, the synchronizing frequency $f_{OSC}$ is in the range from $f_{IN} - f_{OS1}$ to $f_{IN} + f_{OS2}$. According to equation (6), the first frequency offset $f_{OS1}$ and the second frequency offset $f_{OS2}$ can be given by:

$$f_{OS1} = (V_{OS1}/V_{REF})*f_{IN}; \text{ and} \quad (7a)$$

$$f_{OS2} = (V_{OS2}/V_{REF})f_{IN}. \quad (7b)$$

As shown in FIG. 2, the control circuitry 150 further includes a delayer 222 to generate a CLK signal to trigger the counter circuitry 118. The counter circuitry 118 can receive the digital signals $D_{UP}$ and $D_{DOWN}$ at each rising edge (or falling edge) of the CLK signal. The CLK signal is a delayed signal of the DIV_IN signal. The CLK signal can be delayed the amount of time it takes for the DIV_IN signal to be logic high in a cycle. For the example of FIG. 3, in the cycle from time $t_0$ to time $t_2$, the CLK signal is delayed to the time $t_1$. However, the invention is not so limited. The CLK signal can also be delayed any time that is longer than the time during which the DIV_IN signal is logic high in a cycle and shorter than the time of the cycle. By way of example, in the cycle from time $t_0$ to time $t_2$ of FIG. 3, the CLK signal can be delayed to any time between times $t_1$ and $t_2$. As such, when the counter circuitry 118 is triggered by the CLK signal, the counter circuitry 118 receives the digital signals $D_{UP}$ and $D_{DOWN}$ that indicate the comparison result between the top voltage level $V_{OSC}$ and the boundary references $V_L$ and $V_H$.

In one embodiment, the counter circuitry 118 generates a control signal 114, e.g., a digital signal having a value $D_{CTL}$, by accumulating/counting the comparison result 112, e.g., the digital signals $D_{UP}$ and $D_{DOWN}$. By way of example, in response to each rising edge (or falling edge) of the CLK signal, the counter circuitry 118 increases the value $D_{CTL}$ by a predetermined amount $\Delta D$ if the digital signal $D_{UP}$ is "1", or decreases the value $D_{CTL}$ by the predetermined amount $\Delta D$ if the digital signal $D_{DOWN}$ is "1", or maintains the value $D_{CTL}$ unchanged if both the digital signals $D_{UP}$ and $D_{DOWN}$ are "0". In addition, the oscillator circuitry 106 in FIG. 1 can increase the synchronizing frequency $f_{OSC}$ if the value $D_{CTL}$ increases, and decrease the synchronizing frequency $f_{OSC}$ if the value $D_{CTL}$ decreases. Thus, if the synchronizing frequency $f_{OSC}$ is less than the frequency $f_{IN} - f_{OS1}$, e.g., $D_{UP} = 1$ and $D_{DOWN} = 0$, the counter circuitry 118 can increase the value $D_{CTL}$ incrementally by accumulating the digital signal $D_{UP}$. The synchronizing frequency $f_{OSC}$ can increase accordingly. If the synchronizing frequency $f_{OSC}$ is greater than the frequency $f_{IN} + f_{OS2}$, e.g., $D_{UP} = 0$ and $D_{DOWN} = 1$, the counter circuitry 118 can decrease the value $D_{CTL}$ incrementally by accumulating the digital signal $D_{DOWN}$. The synchronizing frequency $f_{OSC}$ can decrease accordingly. If the synchronizing frequency $f_{OSC}$ is in the range ($f_{IN} - f_{OS1}$, $f_{IN} + f_{OS2}$), e.g., $D_{UP} = 0$ and $D_{DOWN} = 0$, the value $D_{CTL}$ remains unchanged to maintain the synchronizing frequency $f_{OSC}$ unchanged.

In one embodiment, the lock circuitry 116 controls the lock range of the synchronizing signal 108 by controlling the boundary references provided to the comparators 236 and 238. By way of example, the lock circuitry 116 includes voltage sources 228, 232 and 234, and a control unit 244. The voltage source 228 provides a preset reference $V_{REF}$, e.g., that determines the charging current $I_{OSC}$ according to equation (1). The voltage sources 232 and 234 can provide the voltage offset $V_{OS1}$ and the voltage offset $V_{OS2}$, respectively. Therefore, the lock circuitry 116 can provide the low boundary reference $V_L$, e.g., $V_{REF}-V_{OS1}$, and the high boundary reference $V_H$, e.g., $V_{REF}+V_{OS2}$, to the comparators 236 and 238. The voltage sources 232 and 234 can also provide a voltage offset $V'_{OS1}$, e.g., $V'_{OS1}>V_{OS1}$, and a voltage offset $V'_{OS2}$, e.g., $V'_{OS2}>V_{OS2}$, respectively. Therefore, the lock circuitry 116 can provide a low boundary reference $V'_L$, e.g., $V_{REF}-V'_{OS1}$, and a high boundary reference $V'_H$, e.g., $V_{REF}+V'_{OS2}$, to the comparators 236 and 238. More specifically, the control unit 244 generates control signals 246 and 248 to control the voltage sources 232 and 234. In one embodiment, the lock/unlock signal 120 in FIG. 1 includes the control signals 246 and 248. The control signals 246 and 248 control the voltage sources 232 and 234 to provide the voltage offsets $V_{OS1}$ and $V_{OS2}$, or $V'_{OS1}$ and $V'_{OS2}$, according to the digital signals $D_{UP}$ and $D_{DOWN}$. On one hand, if the digital signals $D_{UP}$ and $D_{DOWN}$ indicate that the synchronizing signal 108 is outside the lock range, e.g., $D_{UP}=1$ or $D_{DOWN}=1$, the voltage sources 232 and 234 provide the voltage offsets $V_{OS1}$ and $V_{OS2}$, and therefore the lock circuitry 116 provides the boundary references $V_L$ and $V_H$ to the comparators 236 and 238. The lock range of the synchronizing signal 108 can be from $f_{IN}-f_{OS1}$ to $f_{IN}+f_{OS2}$ (e.g., from $f_{IN}*(1-V_{OS1}/V_{REF})$ to $f_{IN}*(1+V_{OS2}/V_{REF})$), and have a first width $f_{OS1}+f_{OS2}$ (e.g., $f_{IN}*(V_{OS1}+V_{OS2})/V_{REF}$). On the other hand, if the digital signals $D_{UP}$ and $D_{DOWN}$ indicate that the synchronizing signal 108 is within the lock range, e.g., $D_{UP}=0$ and $D_{DOWN}=0$, the voltage sources 232 and 234 provide the voltage offsets $V'_{OS1}$ and $V'_{OS2}$, and therefore the lock circuitry 116 provides the boundary references $V'_L$ and $V'_H$ to the comparators 236 and 238. The lock range of the synchronizing signal 108 can be from $f_{IN}-f'_{OS1}$ to $f_{IN}+f'_{OS2}$ (e.g., from $f_{IN}*(1-V'_{OS1}/V_{REF})$ to $f_{IN}*(1+V'_{OS2}/V_{REF})$), and have a second width $f'_{OS1}+f'_{OS2}$ (e.g., $f_{IN}*(V'_{OS1}+V'_{OS2})/V_{REF}$) that is greater than the first width $f_{OS1}+f_{OS2}$.

Figure 4:
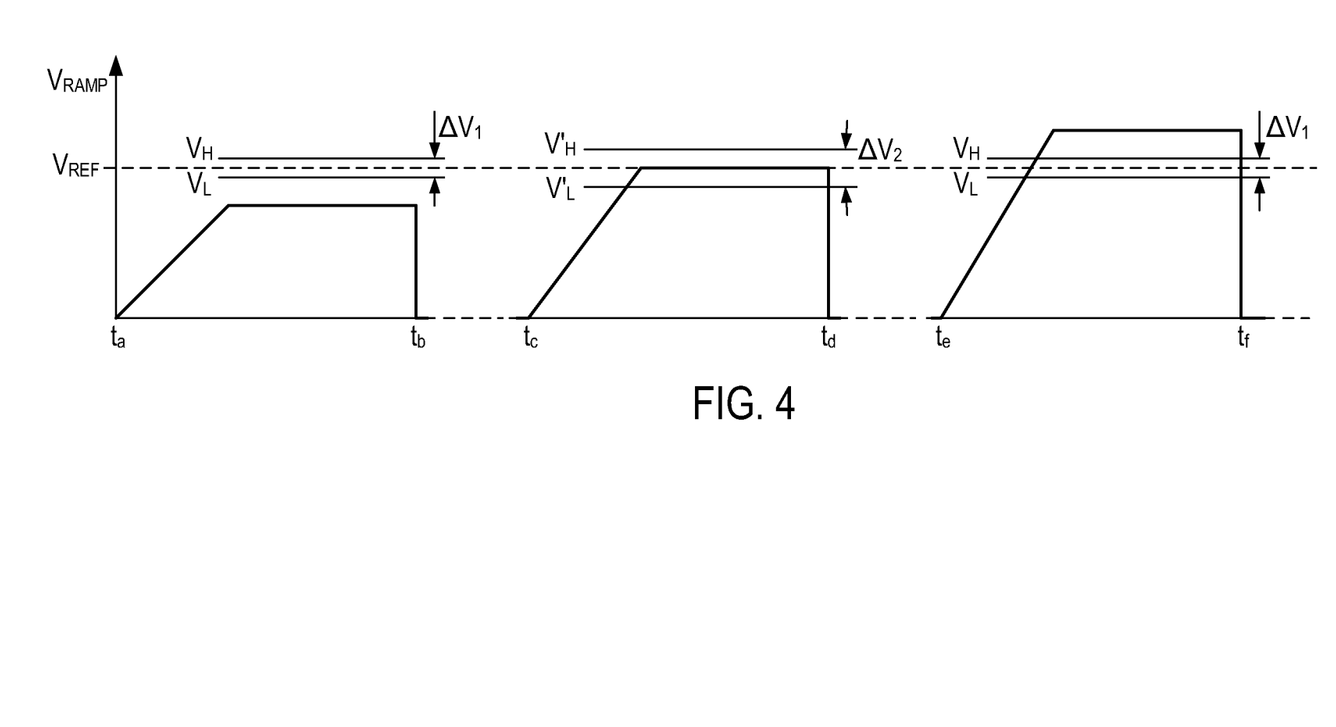
FIG. 4 illustrates a relation diagram of examples of a synchronizing signal and a lock range for the synchronizing signal, in accordance with one embodiment of the present invention.

A relation diagram of examples of the synchronizing signal 108 and the lock range for the synchronizing signal 108 is illustrated in FIG. 4, in accordance with one embodiment of the present invention. FIG. 4 is described in combination with FIG. 1 and FIG. 2. In the example of FIG. 4, during time $t_0$ to time $t_b$, the top voltage level $V_{OSC}$ of the ramp voltage $V_{RAMP}$ is less than the low boundary reference $V_L$, e.g., the synchronizing frequency $f_{OSC}$ is less than the frequency $f_{IN}-f_{OS1}$. During time $t_0$ to time $t_f$, the top voltage level $V_{OSC}$ of the ramp voltage $V_{RAMP}$ is greater than the high boundary reference $V_H$, e.g., the synchronizing frequency $f_{OSC}$ is greater than the frequency $f_{IN}+f_{OS2}$. During time $t_c$ to time $t_d$, the top voltage level $V_{OSC}$ of the ramp voltage $V_{RAMP}$ is within the range of $V'_L$ to $V'_H$, e.g., the synchronizing frequency $f_{OSC}$ is within the range ($f_{IN}-f'_{OS1}$, $f_{IN}+f'_{OS2}$).

In one embodiment, when the signal synchronizing system 100 is enabled, the lock circuitry 116 provides the boundary references $V_L$ and $V_H$ to the frequency comparator circuitry 102, such that the lock range for the synchronizing signal 108 is preset to be from $f_{IN}-f_{OS1}$ to $f_{IN}+f_{OS2}$. If the synchronizing frequency $f_{OSC}$ is outside the range ($f_{IN}-f_{OS1}$, $f_{IN}+f_{OS2}$), e.g., during time $t_0$ to $t_b$ or during time $t_0$ to time $t_f$, the signal synchronizing system 100 adjusts the synchronizing frequency $f_{OSC}$ toward the input frequency $f_{IN}$. When the synchronizing frequency $f_{OSC}$ is adjusted into the range ($f_{IN}-f_{OS1}$, $f_{IN}+f_{OS2}$), the lock circuitry 116 provides the boundary references $V'_L$ and $V'_H$ to the frequency comparator circuitry 102, e.g., during time $t_c$ to time $t_d$, such that the lock range for the synchronizing signal 108 becomes to be from $f_{IN}-f'_{OS1}$ to $f_{IN}+f'_{OS2}$. As shown in FIG. 4, the range ($f_{IN}-f'_{OS1}$, $f_{IN}+f'_{OS2}$) represented by the parameter $\Delta V_2$ is wider than the range ($f_{IN}-f_{OS1}$, $f_{IN}+f_{OS2}$) represented by the parameter $\Delta V_1$. Additionally, if a change in the input frequency $f_{IN}$ causes the synchronizing frequency $f_{OSC}$ to be outside the range ($f_{IN}-f'_{OS1}$, $f_{IN}+f'_{OS2}$), the lock range for the synchronizing signal 108 can become to be from $f_{IN}-f_{OS1}$ to $f_{IN}+f_{OS2}$ again.

Figure 5:
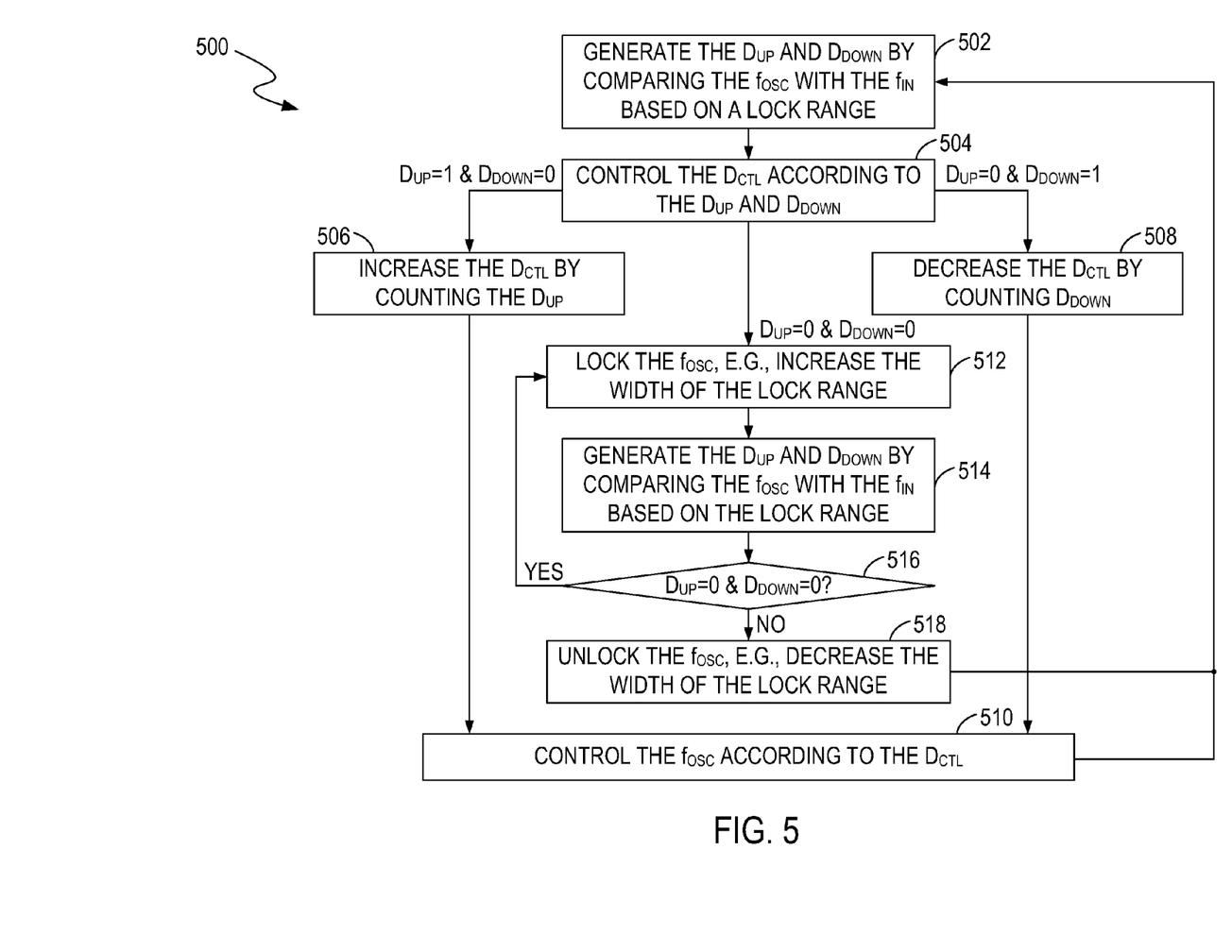
FIG. 5 illustrates a flowchart of examples of operations performed by a signal synchronizing system, in accordance with one embodiment of the present invention.

FIG. 5 illustrates a flowchart 500 of examples of operations performed by the signal synchronizing system 100, in accordance with one embodiment of the present invention. Although specific steps are disclosed in FIG. 5, such steps are examples for illustrative purposes. That is, the present invention is well suited to performing various other steps or variations of the steps recited in FIG. 5. FIG. 5 is described in combination with FIG. 1, FIG. 2, FIG. 3 and FIG. 4.

When the signal synchronizing system 100 is enabled, the lock range for the synchronizing signal 108 is set to be from $f_{IN}-f_{OS1}$ to $f_{IN}+f_{OS2}$. By way of example, the lock circuitry 116 provides the boundary references $V_L$ and $V_H$ to the comparators 236 and 238. At step 502, the frequency comparator circuitry 102 generates the digital signals $D_{UP}$ and $D_{DOWN}$ by comparing the synchronizing frequency $f_{OSC}$ with the input frequency $f_{IN}$ based on the range ($f_{IN}-f_{OS1}$, $f_{IN}+f_{OS2}$). If the synchronizing frequency $f_{OSC}$ is less than the frequency $f_{IN}-f_{OS1}$, then $D_{UP}=1$ and $D_{DOWN}=0$. If the synchronizing frequency $f_{OSC}$ is greater than the frequency $f_{IN}+f_{OS2}$, then $D_{UP}=0$ and $D_{DOWN}=1$. If the synchronizing frequency $f_{OSC}$ is substantially equal to the input frequency $f_{IN}$, e.g., the synchronizing frequency $f_{OSC}$ is greater than the frequency $f_{IN}-f_{OS1}$ and less than the frequency $f_{IN}+f_{OS2}$, then $D_{UP}=0$ and $D_{DOWN}=0$.

At step 504, the counter circuitry 118 controls a value $D_{CTL}$ of the control signal 114 according to the digital signals $D_{UP}$ and $D_{DOWN}$. By way of example, if $D_{UP}=1$ and $D_{DOWN}=0$, the flowchart 500 goes to step 506 to increase the value $D_{CTL}$. If $D_{UP}=0$ and $D_{DOWN}=1$, the flowchart 500 goes to step 508 to decrease the value $D_{CTL}$. If $D_{UP}=0$ and $D_{DOWN}=0$, the flowchart 500 goes to step 512 to maintain the value $D_{CTL}$ unchanged and lock the synchronizing frequency $f_{OSC}$.

At step 506, the counter circuitry 118 increases the value $D_{CTL}$ by counting/accumulating the digital signal $D_{UP}$. For example, the counter circuitry 118 increases the value $D_{CTL}$ by a predetermined amount $\Delta D$ when receiving the digital signal $D_{UP}$ that is "1". At step 508, the counter circuitry 118 decreases the value $D_{CTL}$ by counting/accumulating the digital signal $D_{DOWN}$. For example, the counter circuitry 118 decreases the value $D_{CTL}$ by a predetermined amount $\Delta D$ when receiving the digital signal $D_{DOWN}$ that is "1". At step 510, the oscillator circuitry 106 increases the synchronizing frequency $f_{OSC}$ if the value $D_{CTL}$ increases, and decreases the synchronizing frequency $f_{OSC}$ if the value $D_{CTL}$ decreases. Following step 510, the flowchart 500 can return to step 502.

At step 512, the lock circuitry 116 locks the synchronizing frequency $f_{OSC}$ by increasing the lock range from the first width $f_{OS1}+f_{OS2}$ to the second width $f'_{OS1}+f'_{OS2}$. The lock range for the synchronizing frequency $f_{OSC}$ becomes to be from $f_{IN}-f'_{OS1}$ to $f_{IN}+f'_{OS2}$. By way of example, the lock circuitry 116 provides the boundary references $V'_L$ and $V'_H$ to the comparators 236 and 238.

At step 514, the frequency comparator circuitry 102 generates the digital signals $D_{UP}$ and $D_{DOWN}$ by comparing the synchronizing frequency $f_{OSC}$ with the input frequency $f_{IN}$ based on the range ($f_{IN}-f'_{OS1}$, $f_{IN}+f'_{OS2}$). If the synchronizing frequency $f_{OSC}$ is less than the frequency $f_{IN}-f'_{OS1}$, then $D_{UP}=1$ and $D_{DOWN}=0$. If the synchronizing frequency $f_{OSC}$ is greater than the frequency $f_{IN}+f'_{OS2}$, then $D_{UP}=0$ and $D_{DOWN}=1$. If the synchronizing frequency $f_{OSC}$ is greater than the frequency $f_{IN}-f'_{OS1}$ and less than the frequency $f_{IN}+f'_{OS2}$, then $D_{UP}=0$ and $D_{DOWN}=0$.

At step 516, if the synchronizing frequency $f_{OSC}$ is in the range ($f_{IN}-f'_{OS1}$, $f_{IN}+f'_{OS2}$), e.g., $D_{UP}=0$ and $D_{DOWN}=0$, the flowchart 500 goes to step 512. If the synchronizing frequency $f_{OSs}$ is outside the range ($f_{IN}-f'_{OS1}$, $f_{IN}+f'_{OS2}$), e.g., $D_{UP}=1$ or $D_{DOWN}=1$, the flowchart 500 goes to step 518. At step 518, the lock circuitry 116 unlocks the synchronizing frequency $f_{OSC}$ by decreasing the lock range from the second width $f'_{OS1}+f'_{OS2}$ to the first width $f_{OS1}+f_{OS2}$. The lock circuitry 116 can provide the boundary references $V_L$ and $V_H$ to the comparators 236 and 238, such that the lock range for the synchronizing frequency $f_{OSC}$ becomes to be from $f_{IN}-f_{OSC}$ to $f_{IN}+f_{OS2}$. Following step 518, the flowchart 500 can return to step 502.

By performing the operations of the flowchart 500, the signal synchronizing system 100 can synchronize the synchronizing signal 108 with the input signal 110 relatively accurately, and enhance the stability of the synchronizing signal 108.

Figure 6:
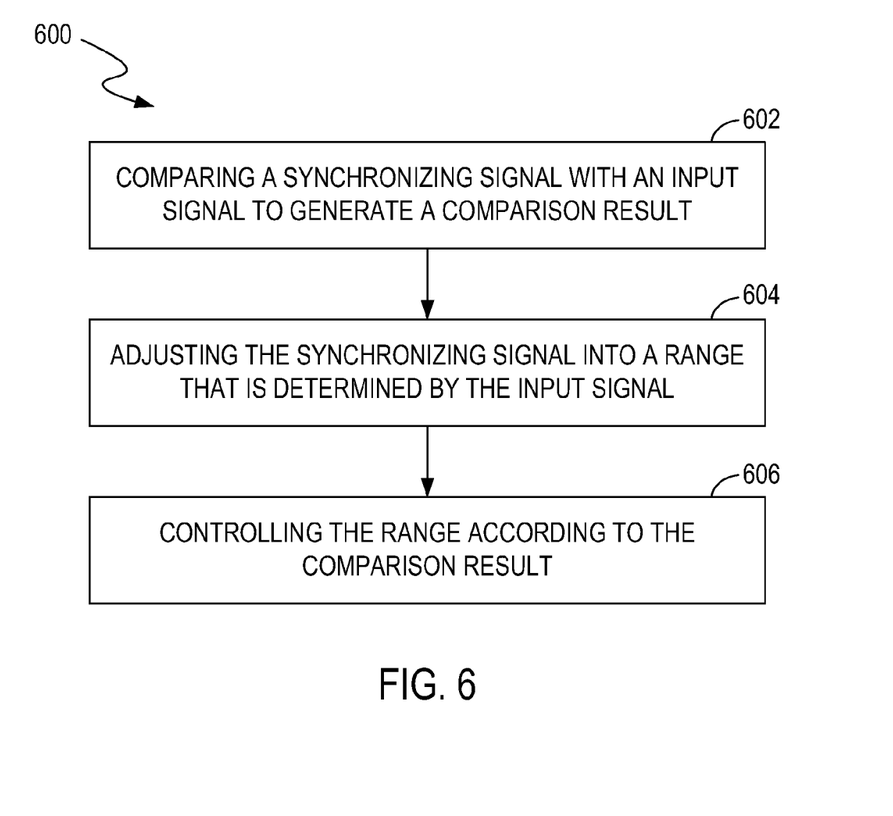
FIG. 6 illustrates a flowchart of examples of operations performed by a signal synchronizing system, in accordance with one embodiment of the present invention.

FIG. 6 illustrates a flowchart 600 of examples of operations performed by the signal synchronizing system 100, in accordance with one embodiment of the present invention. FIG. 6 is described in combination with FIG. 1, FIG. 2, FIG. 3, FIG. 4 and FIG. 5.

In block 602, the frequency comparator circuitry 102 compares the synchronizing frequency $f_{OSC}$ of the synchronizing signal 108 with the input frequency $f_{IN}$ of the input signal 110 to generate the comparison result 112, e.g., the digital signals $D_{UP}$ and $D_{DOWN}$, based on a lock range, e.g., the range ($f_{IN}-f_{OS1}$, $f_{IN}+f_{OS2}$).

In block 604, the counter circuitry 118 adjusts the synchronizing signal 108 into the lock range, e.g., the range ($f_{IN}-f_{OS1}$, $f_{IN}+f_{OS2}$), that is determined by the input frequency $f_{IN}$ of the input signal 110.

In block 606, the lock circuitry 116 controls the lock range according to the comparison result 112. By way of example, if the comparison result 112 indicates the synchronizing frequency $f_{OSC}$ is outside the range ($f_{IN}-f_{OS1}$, $f_{IN}+f_{OS2}$), the counter circuitry 118 adjusts the synchronizing frequency $f_{OSC}$ toward the input frequency $f_{IN}$. When the synchronizing signal 108 is adjusted into the range ($f_{IN}-f_{OS1}$, $f_{IN}+f_{OS2}$), the lock circuitry 116 changes the lock range to the range ($f_{IN}-f'_{OS1}$, $f_{IN}+f'_{OS2}$). If a change occurs in the input frequency $f_{IN}$ such that the synchronizing frequency $f_{OSC}$ is outside the range ($f_{IN}-f'_{OS1}$, $f_{IN}+f'_{OS2}$), the lock circuitry 116 changes the lock range to the range ($f_{IN}-f_{OS1}$, $f_{IN}+f_{OS2}$) again.

Accordingly, embodiments according to the present invention provide signal synchronizing systems. The system can synchronize a synchronizing frequency with an input frequency by adjusting the synchronizing frequency into a lock range. The lock range can have a smaller width when the synchronizing frequency is outside the lock range, such that the synchronizing frequency is synchronized with the input frequency more accurately. In addition, the lock range can have a larger width when the synchronizing frequency is in the lock range, such that the synchronizing frequency is more stable. The signal synchronizing system can be used in many applications such as direct-current to direct-current (DC to DC) controllers in vehicle electronic systems.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A signal synchronizing system comprising:
    comparison circuitry operable for comparing a synchronizing signal with an input signal to generate a comparison result; and
    control circuitry coupled to said comparison circuitry and operable for adjusting said synchronizing signal into a range that is determined by said input signal, and operable for controlling said range according to said comparison result, wherein said range has a first width if said comparison result indicates that said synchronizing signal is outside said range, and wherein said range has a second width that is greater than said first width if said comparison result indicates that said synchronizing signal is within said range.

2. The signal synchronizing system as claimed in claim 1, wherein said comparison circuitry compares a synchronizing frequency of said synchronizing signal with an input frequency of said input signal to generate said comparison result.

3. The signal synchronizing system as claimed in claim 1, wherein said comparison circuitry comprises:
    a switch controlled by said input signal;
    a power source coupled to said switch and operable for generating a current according to said synchronizing signal to charge capacitive circuitry via said switch; and
    a comparator coupled to said capacitive circuitry and operable for comparing a voltage on said capacitive circuitry with a boundary reference to generate said comparison result.

4. The signal synchronizing system as claimed in claim 3, wherein said power source also generates said current according to a preset reference that determines said boundary reference.

5. The signal synchronizing system as claimed in claim 3, wherein said control circuitry controls said range by controlling said boundary reference.

6. The signal synchronizing system as claimed in claim 1, wherein said control circuitry comprises counter circuitry to generate a control signal by accumulating said comparison result.

7. The signal synchronizing system as claimed in claim 6, further comprising:
    oscillator circuitry coupled to said counter circuitry and operable for generating said synchronizing signal and adjusting a synchronizing frequency of said synchronizing signal according to said control signal.

8. The signal synchronizing system as claimed in claim 6, wherein said control signal increases a synchronizing frequency of said synchronizing signal if said synchronizing frequency is less than an input frequency of said input signal, and wherein said control signal decreases said synchronizing frequency if said synchronizing frequency is greater than said input frequency.

9. A method for synchronizing a signal, said method comprising:
- comparing a synchronizing signal with an input signal to generate a comparison result;
- adjusting said synchronizing signal into a range that is determined by said input signal;
- controlling said range to have a first width if said comparison result indicates that said synchronizing signal is within said range; and
- controlling said range to have a second width that is greater than said first width if said comparison result indicates that said synchronizing signal is outside said range.

10. The method as claimed in claim 9, wherein said comparing comprises:
- comparing a synchronizing frequency of said synchronizing signal with an input frequency of said input signal to generate said comparison result.

11. The method as claimed in claim 9, wherein said comparing comprises:
- controlling a switch using said input signal;
- generating a current according to said synchronizing signal to charge capacitive circuitry via said switch; and
- comparing a voltage on said capacitive circuitry with a boundary reference to generate said comparison result.

12. The method as claimed in claim 11, wherein said generating comprises:
- generating said current also according to a preset reference that determines said boundary reference.

13. The method as claimed in claim 11, wherein said controlling said range comprises:
- controlling said range by controlling said boundary reference.

14. The method as claimed in claim 9, wherein said controlling comprises:
- generating a control signal by accumulating said comparison result.

15. The method as claimed in claim 14, wherein said controlling further comprises:
- increasing a synchronizing frequency of said synchronizing signal using said control signal if said synchronizing frequency is less than an input frequency of said input signal; and
- decreasing said synchronizing frequency using said control signal if said synchronizing frequency is greater than said input frequency.

16. A signal synchronizing system comprising:
- control circuitry operable for adjusting a synchronizing signal into a range that is determined by an input signal, and operable for controlling said range according to a difference between said synchronizing signal and said input signal, wherein said range has a first width if said difference is greater than an offset, and wherein said range has a second width that is greater than said first width if said difference is less than said offset; and
- signal generator circuitry coupled to said control circuitry and operable for generating said synchronizing signal according to said difference between said synchronizing signal and said input signal.

17. The signal synchronizing system as claimed in claim 16, wherein said signal generator circuitry increases a synchronizing frequency of said synchronizing signal if said difference is less than a first frequency offset, and wherein said signal generator circuitry decreases said synchronizing frequency if said difference is greater than a second frequency offset.

18. The signal synchronizing system as claimed in claim 16, further comprising:
- a switch controlled by said input signal;
- a power source coupled to said switch and operable for generating a current according to said synchronizing signal to charge capacitive circuitry via said switch; and
- a comparator coupled to said capacitive circuitry and operable for comparing a voltage on said capacitive circuitry with a boundary reference to generate a comparison result.

19. The signal synchronizing system as claimed in claim 18, wherein said power source also generates said current according to a preset reference that determines said boundary reference.

20. The signal synchronizing system as claimed in claim 18, wherein said control circuitry controls said range by controlling said boundary reference.

* * * * *